United States Patent [19]
Bahng

[11] Patent Number: 5,199,483
[45] Date of Patent: Apr. 6, 1993

[54] METHOD AND APPARATUS FOR COOLING WAFERS

[75] Inventor: Kenneth J. Bahng, Sunnyvale, Calif.

[73] Assignee: Applied Materials, Inc., Santa Clara, Calif.

[21] Appl. No.: 701,437

[22] Filed: May 15, 1991

[51] Int. Cl.⁵ .......................... B25B 11/00; F28F 7/00
[52] U.S. Cl. ........................................ 165/1; 165/80.1; 269/903; 118/728
[58] Field of Search .............. 165/1, 80.1, 80.4, 80.5; 118/59, 69, 724, 728; 269/900, 902, 903, 309

[56] References Cited
U.S. PATENT DOCUMENTS

| | | | |
|---|---|---|---|
| 4,433,835 | 2/1984 | Wheeler | 269/14 |
| 4,724,621 | 2/1988 | Hobson et al. | 34/218 |
| 4,842,683 | 6/1989 | Cheng et al. | 156/345 |

Primary Examiner—Allen J. Flanigan
Attorney, Agent, or Firm—Paul L. Hickman; Michael A. Glenn

[57] ABSTRACT

A wafer cooling apparatus characterized by a chamber, a pedestal disposed within the chamber and a mechanism for lowering a semiconductor wafer onto an upper surface of the pedestal. The upper surface of the pedestal is grooved to allow gas trapped between the wafer and the pedestal surface to escape around the periphery of the wafer, thereby minimizing the tendency of the wafer to "skate" across the surface of the pedestal on a thin layer of gas. The method involves extending a number of pins through a grooved cooling surface of the pedestal to contact a wafer, and retracting the pins into the pedestal to lower the wafer to the cooling surface and to force gas trapped between the wafer and the pedestal into the grooves of the pedestal.

24 Claims, 5 Drawing Sheets

METHOD AND APPARATUS FOR COOLING WAFERS

BACKGROUND OF THE INVENTION

This invention relates generally to semiconductor wafer processing equipment and more particularly apparatus for cooling semiconductor wafers after they have been subjected to high-temperature processing.

Integrated circuits are formed on semiconductor wafers by subjecting the wafers to a number of deposition, masking, doping and etching processes. Some of these processes occur at relatively high temperatures. For example, the deposition of of epitaxial or polysilicon layers usually requires a wafer to be heated to a temperature in the range of 600° C.–1200° C.

A wafer subjected to a high temperature process must often be cooled before it is further processed or stored. This is due, in part, to the requirement of many processes for a relatively cool wafer and is also due to the fact that a hot wafer is very reactive with water vapor and a variety of other gasses and therefore cannot be exposed to the ambient environment in its heated state. Also, plastic wafer storage cassettes begin to melt at about 70° C., so wafers have to be cooled below that temperature before they are stored in a cassette.

A variety of semiconductor equipment manufacturers provide multi-chamber semiconductor processing systems. For example, Applied Materials, Inc. of Santa Clara, Calif. sells multi-chamber processing systems under the trademarks "Precision 5000" and "Endura 5500" which include a mainframe assembly capable of supporting four or more processing chambers. A mainframe assembly includes a gas distribution system, a vacuum system, a load-lock system, a robotic wafer handling system, and a process control computer. Each of the processing chambers is adapted to perform a specific process such as an etch, chemical vapor deposition (CVD) or a physical vapor deposition (PVD) process.

Multi-chamber processing systems are well suited for single-wafer processing, as opposed to the batch wafer processing prevalent in the past. Single wafer processing is particularly advantageous for larger wafer diameters, such as 200 mm wafers, because it is easier to obtain good process uniformity over the surface of a single wafer than it is to obtain such uniformity over the surfaces of a batch of wafers. Uniformity, both within a wafer and wafer-to-wafer, is increasingly important as the density of integrated circuitry increases.

A problem with single-wafer, multi-chamber processing systems is that the throughput of the system (i.e. the number of wafers per unit time which can be processed) is dependent upon the slowest process to which the wafers are subjected. For example, if a wafer is subjected to a high-temperature process in a particular chamber and then must remain within that chamber until the wafer is sufficiently cool to move, the throughput of the system is adversely affected.

In consequence, there is a need in the industry for a method and apparatus for cooling wafers in such a manner that it does not adversely affect the throughput of a multi-chamber processing system. The cooling method must furthermore cool the wafer in a predictable and uniform manner and within a non-reactive environment to minimize the creation of defects in the integrated circuitry being formed on the semiconductor wafer.

SUMMARY OF THE INVENTION

The present invention provides a method and apparatus for predictably and uniformly cooling a semiconductor wafer with minimal impact on the throughput of a multi-chamber processing system. The present invention further solves the problem of wafer "skating" where a wafer may glide across the smooth surface of a pedestal on a thin layer of gas.

The apparatus of the present invention includes a chamber, a pedestal assembly having a support surface exposed to the chamber, and mechanism for lowering a wafer to the pedestal. The pedestal includes a support body having a relatively high thermal mass and good thermal conductivity and is provided with a planar, grooved wafer support surface. The mechanism for lowering the wafer to the pedestal includes a number of pins which retractably extend through the wafer support surface. The apparatus may optionally include a gas delivery system to introduce a cooling gas into the chamber. As the wafer is lowered to the pedestal, gas trapped between the wafer and the pedestal is forced into the grooves of the wafer support surface and at least partially out from beneath the wafer to eliminate the tendency of the wafer to skate across the surface of the pedestal.

A method for cooling a wafer in a gaseous environment in accordance with the present invention includes the steps of: positioning a wafer over a flat, grooved surface of a pedestal made from a material having a relatively high thermal mass and good thermal conductivity; extending a plurality of pins through the surface of the pedestal to contact the wafer; and retracting the pins to lower the wafer towards the grooved surface, thereby forcing gas into the grooves and at least partially out from beneath the wafer.

An advantage of this invention is that a wafer may be predictably, uniformly, and reliably cooled in a dedicated cool-down chamber, thereby increasing the throughput of an associated multi-chamber semiconductor wafer processing system.

Another advantage of this invention is that the tendency for a wafer to skate across the surface of the pedestal has been eliminated. As such, the need for wafer clamps, stops or the like to hold a wafer in place on the pedestal has also been eliminated, thereby reducing the cost of the pedestal and allowing the pedestal to accommodate wafers having a range of diameters. This is in marked contrast to prior art systems having pedestals which can only accommodate a single size of wafer, requiring the time consuming removal and replacement of a pedestal when wafers of a different diameter are to be processed.

The present invention is also advantageous in that the combination of conductive cooling via the pedestal and convective cooling by the chamber gasses permits the rapid but uniform cooling of a semiconductor wafer. The large thermal mass and good thermal conductivity of the pedestal ensures that the temperature across the wafer is substantially constant during the cooling process.

These and other advantages of the present invention will become clear to those skilled in the art upon a study of the detailed description of the invention and of the several figures of the drawings.

DETAILED DESCRIPTION OF THE PREFERRED EMBODIMENTS

Figure 1:
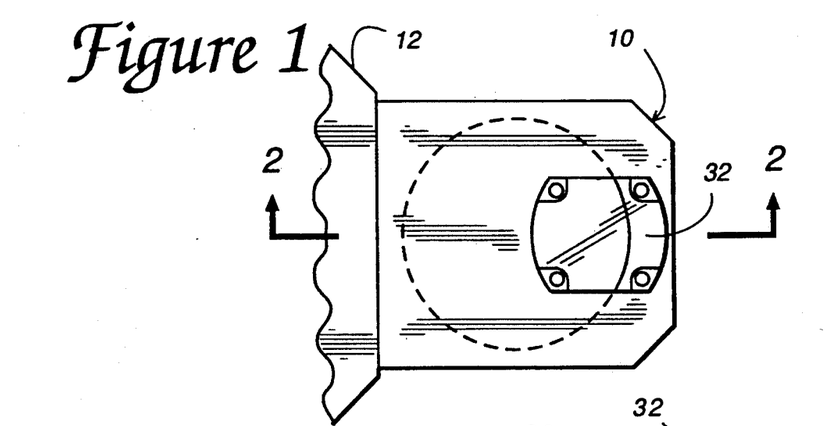
FIG. 1 is a partial top-plan view of a wafer cooling apparatus in accordance with the present invention.

In FIG. 1, a wafer cooling apparatus 10 in accordance with the present invention is shown attached to a mainframe unit 12 which provides electrical, plumbing and other support functions for the apparatus 10. Mainframe units that are compatible with the preferred embodiment of wafer cooling apparatus 10 are currently commercially available as the Precision 5000 ™ and the Endura 5500 ™ systems from Applied Materials, Inc. of Santa Clara, Calif.

Figure 2:
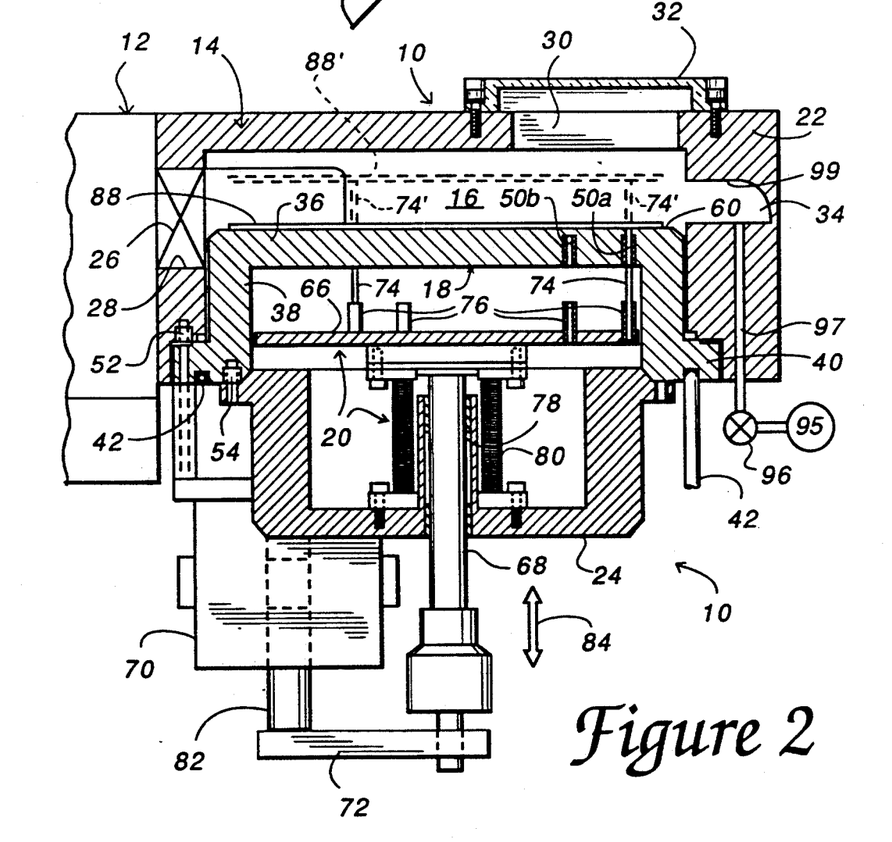
FIG. 2 is a partial cross-sectional view taken along line 2—2 of FIG. 1.

With additional reference to the cross-sectional view of FIG. 2, the wafer cooling apparatus 10 includes an enclosure assembly 14 defining a cool-down chamber 16, a pedestal assembly 18, and a wafer lowering mechanism 20. The cooling apparatus 10 is preferably removably attached to the mainframe 12, such as with bolts (not shown), so that the apparatus 12 can be removed for maintenance or repair or can be replaced with another chamber.

The enclosure assembly 14 includes an upper enclosure portion 22 and a lower enclosure portion 24. The material of the enclosure assembly is preferably made from a process compatible material such as aluminum. The upper enclosure portion 22 can optionally be provided with a slit-valve 26 which can open or close an aperture 28 between a transfer chamber of mainframe 12 and the cool-down chamber 16. Alternatively, the aperture 28 can be left open to the transfer chamber of mainframe unit 12. The slit-valve 26 is preferably controlled by a control signal generated by the mainframe 12. The upper enclosure portion 22 is provided with an opening 30 which can be closed by a cover 32 (which preferably includes a sealed quartz window), and a gas inlet port 34. If the enclosure assembly is provided with the slit-valve 26, a gas outlet port (not shown) is provided to exhaust gas from the chamber 16. Alternatively, in the absence of a slit-valve 26 gasses can be exhausted from the chamber 16 through aperture 28 by a pumping system provided by mainframe unit 12.

Figure 3:
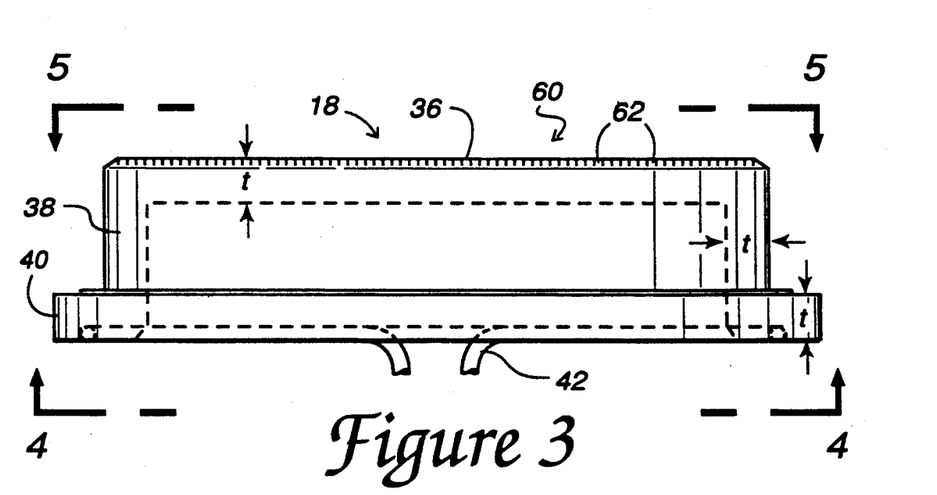
FIG. 3 is an elevational view of an anti-skating pedestal in accordance with the present invention.
Figure 4:
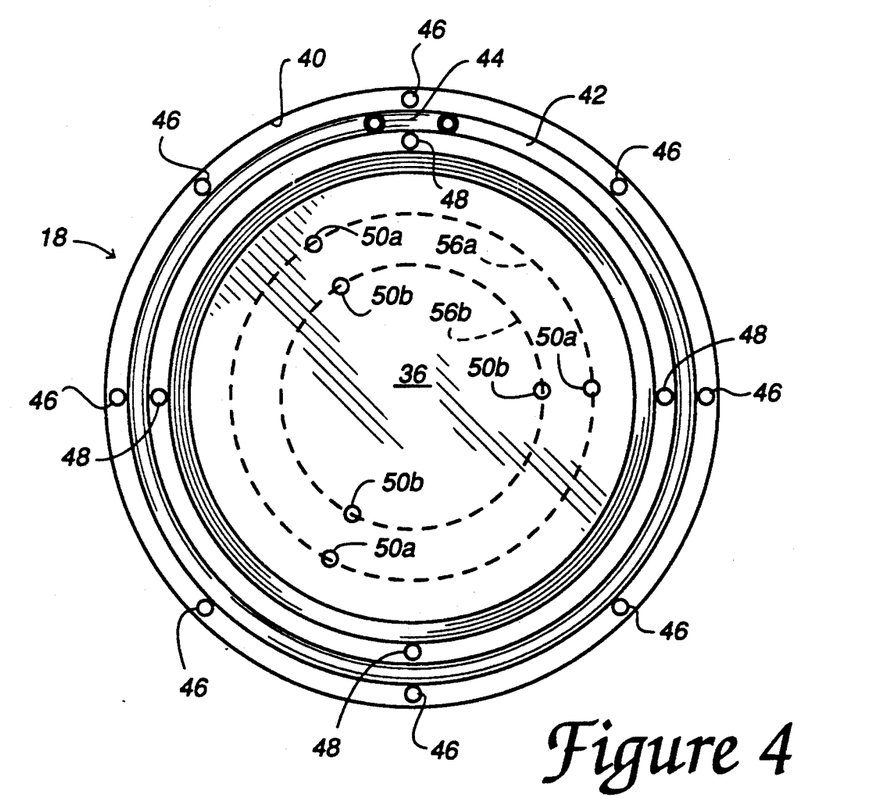
FIG. 4 is a bottom plan view taken along line 4—4 of FIG. 3.

In FIGS. 2, 3 and 4 it can be seen that the pedestal assembly 18 includes a wafer support body 36, a downwardly extending skirt portion 38, a flange 40, and a cooling conduit 42. The flange 40 of pedestal assembly 18 forms a portion of the enclosure assembly 14. In this preferred embodiment, wafer support body 36, the skirt portion 38, and flange 40 are formed as a unitary structure either by a casting process or by machining the structure from a large block of aluminum.

The pedestal assembly 18, in general, and the wafer support body 36, in particular, should be made from a material having a relatively high thermal mass and good thermal conductivity to facilitate the absorption of heat from a wafer being cooled on its upper surface. However, the pedestal assembly material must also be process compatible with the semiconductor wafer. Aluminum is a favored choice for the material of pedestal assembly 18 because it has a relatively high thermal conductivity of approximately 2.37 watts/cm-°C., yet it will not poison or otherwise damage a cooling semiconductor wafer. More particularly, it has been found that 6061-T6 aluminum is a good choice of material for the production of pedestal assembly 18.

A relatively high thermal mass for pedestal assembly 18 is achieved by making the wafer support body 36, skirt portion 38 and flange 40 relatively thick. In this preferred embodiment, for example, the thickness t of the support body 36, skirt portion 38, and flange 40 is about 0.65 inches. Given that the diameter of the wafer support body 36 is 8.5 inches, the diameter of the flange 40 is 9.9 inches, and the height of the pedestal assembly 18 is 2.65 inches, the total mass of the pedestal assembly is about 3.25 kilograms. The large thermal mass of the pedestal assembly 18 can absorb the heat of a wafer without a large temperature rise and the good thermal conductivity of the pedestal assembly minimizes temperature gradients along the support surface, thereby ensuring that a wafer placed upon the upper surface of the pedestal assembly 18 will cool rapidly but uniformly so that no one portion of the wafer will be at a significantly different temperature than any other portion of the wafer. Such uniform cooling is important to reduce the formation of defects, such as slip or shear defects in the crystalline structure of the cooling wafer.

As best seen in the bottom plan view of FIG. 4, the cooling conduit 42 is embedded in an annular groove 44 formed in the flange 40 of pedestal assembly 18. The cooling conduit 42 is preferably made from copper to provide good thermal conductivity, and has an internal diameter of about ¼ inch. In operation, a cooling fluid is circulated through the conduit 42 to actively remove heat from the pedestal assembly 18. As used herein, the "active" removal of heat refers to the flow of a coolant fluid (such as a liquid in conduit 42 or a gas across various surfaces of the pedestal) to remove heat from the pedestal assembly 18, as opposed to the passive radiation of heat by the pedestal assembly. In the present embodiment, tap water at approximately 15° C.-25° C. and a maximum pressure of about 5.6 kg/cm$^2$ is the coolant fluid of choice for conduit 42. After the water flows through the conduit 42 it is typically discarded into a sewage system or is recycled.

As can be seen in FIG. 4, the pedestal assembly 18 includes a number of bore holes 46, 48, 50a and 50b. The bore holes 46 accommodate bolts (such as a bolt 52 in FIG. 2) which attaches the pedestal assembly 18 to the upper enclosure portion 22. The bore holes 48 accommodate bolts (such as a bolt 54 in FIG. 2) which attaches the lower enclosure portion 24 to the pedestal assembly 18. With additional reference to FIG. 2, the bore holes 50a are arranged in a circular pattern 56a, while bore holes 50b are arranged in a smaller circular pattern 56b. The bore holes 50a and 50b are sometimes referred to as "clearance holes".

Figure 5:
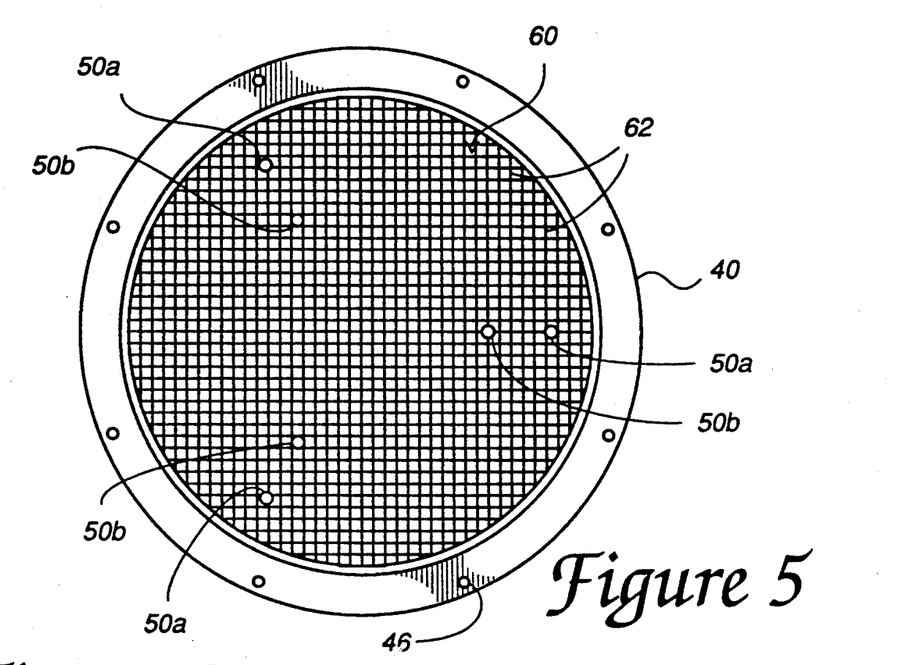
FIG. 5 is a top plan view taken along line 5—5 of FIG. 3.

As seen in FIGS. 3 and 5, a wafer support surface 60 of pedestal assembly 18 is substantially planar and is provided with a number of grooves 62. The grooves comprise an important anti-skating feature of the present invention and further allow for a better solid-to-solid contact between the bottom of a semiconductor wafer and the wafer support surface 60. The grooves 62 in FIG. 4 are arranged in a grid-like pattern on surface 60 and, in this preferred embodiment, are approximately 0.040 inches wide, 0.030 inches deep, and are spaced 0.200 inches apart. The grooves 62 can be made in a number of ways such as by sawing, milling, or by a casting process.

Figure 6:
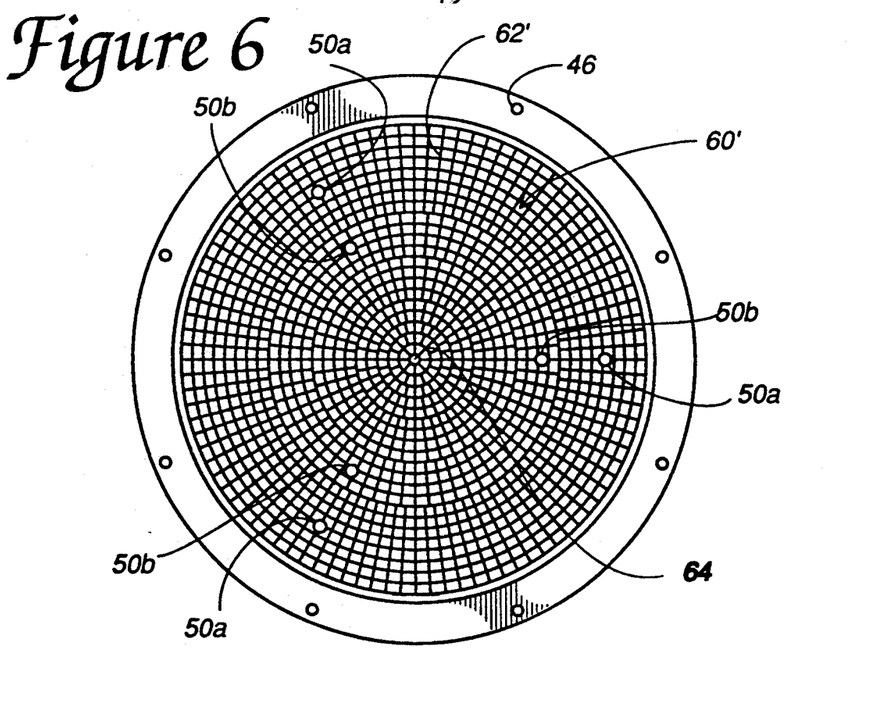
FIG. 6 is a top plan view of an alternate embodiment of an anti-skating pedestal in accordance with the present invention.

In FIG. 6 an alternate embodiment for the groove pattern is shown where a wafer support surface 60' includes a pattern of grooves 62' including radial groove segments and concentric, circular grooves. The radial groove segments radiate outwardly from an interior location such as center 64 of the surface 60' and are formed in a series of concentric rings to reduce the radial spread between adjacent grooves segments.

FIGS. 5 and 6 illustrate the fact that many groove patterns can be provide on the wafer support surface of the pedestal assembly 18. The size nd arrangement of the grooves can be empirically determined, although it appears that groove widths less than about 0.020 inches are too narrow to prevent the anti-skating feature of this invention at pressures near atmospheric pressure.

It should also be noted that there are other channel arrangements for the pedestal assembly 18 which can channel fluids away from the wafer support surface 60. For example, the wafer support surface can be perforated with a plurality of holes which lead to an internal manifold which exhausts through the skirt portion 38 of the pedestal assembly. As will be discussed in greater detail subsequently, an important feature of the grooves or any other type of fluid channeling arrangement is to permit the flow of fluid from between the bottom of a wafer and the wafer support surface to prevent the skating of the wafer and to promote good solid-to-solid contact between the wafer and the pedestal if the wafer is lowered all the way to the pedestal.

With reference to FIG. 2, the wafer lowering mechanism 20 includes a plate 66 supported by a shaft 68, an actuator 70, a link 72, and a number of wafer support pins 74. The wafer support pins 74, which are made from a process compatible material such as quartz, are supported by sleeves 76 which are attached to the top surface of plate 66. The pins 74 extend through bore holes 50a of pedestal assembly 18 and can be retractably extended into the cool-down chamber 16 through the wafer support surface 60. By opening cover 32, the pins 74 can be removed from the bore-holes 50a and inserted into the bore-holes 50b to accommodate wafers of a smaller diameter. More specifically, when the pins 74 are within bore holes 50a they form the circular pattern 56a which is approximately 6.6 inches in diameter and are thus well suited to support 200 mm (8 inch) semiconductor wafers. When the pins 74 are inserted into bore holes 50b they form the circular pattern 56b which is approximately 4.5 inches in diameter and thus are well suited to support 150 mm (6 inch) semiconductor wafers. In consequence, since the pedestal assembly 18 does not require any edge clamps, stops or rims to hold a wafer in place, wafers of various sizes can be accommodated by a single pedestal by simply moving the support pins inwardly or outwardly along the support surface 60. Preferably, three support pins 74 are utilized to support a semiconductor wafer since three support points always define a plane and will therefore support the planar lower surface of a semiconductor wafer in a stable manner.

The shaft 68 of the wafer lowering mechanism 20 is retained by a clearance hole and seal assembly 78 which is attached to lower enclosure portion 24. Bellows 80 are coupled between the plate 66 and the lower enclosure portion 24 to prevent fluid communication between the interior portions of enclosure assembly 14 and the ambient environment. The actuator 70 is provided with a piston 82, which may be electrically, pneumatically or hydraulically actuated to cause movement of shaft 68 as indicated by arrow 84, causing a corresponding vertical movement of the pins 74.

Figure 7:
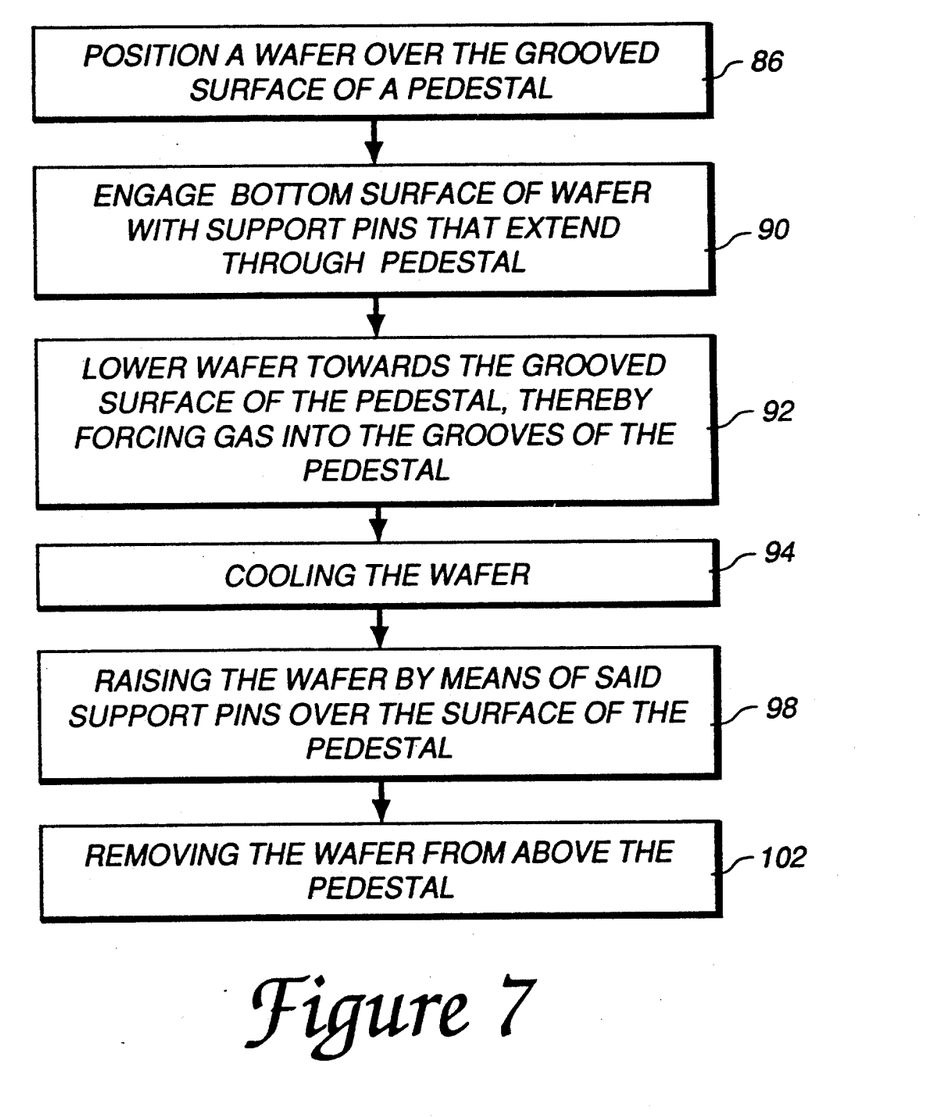
FIG. 7 is a flow diagram of a method for lowering a wafer onto a pedestal in accordance with the present invention.
Figure 8:
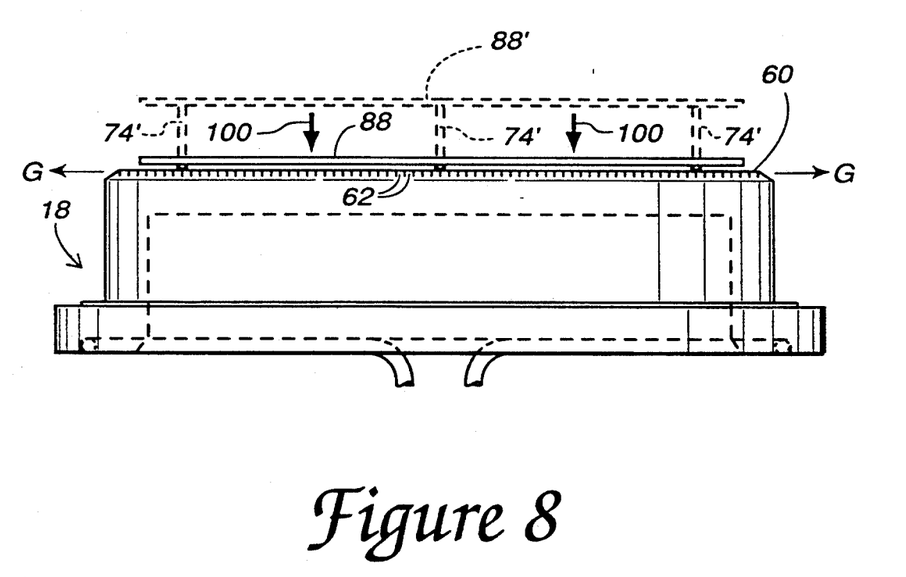
FIG. 8 is an elevational view illustrating the operation of an anti-skating pedestal of the present invention.

The process of the present invention will be discussed with reference to the flow diagram of FIG. 7 in conjunction the with FIGS. 1, 2 and 8. First, in a process step 86, a wafer 88 is positioned as shown at 88' over the grooved wafer support surface 60 of a pedestal. In this preferred embodiment, the positioning is accomplished by a robot-controlled support blade (not shown) of the mainframe unit 12. Next, in a step 90, the bottom surface of the wafer is engaged by support pins 74 by extending the support pins through the wafer support surface 60 of the pedestal assembly 18 to a position 74'. The extended support pins 74 raise the wafer off of the support blade and the support blade is retracted. In a step 92 the wafer is lowered towards the grooved wafer support surface 60 of the pedestal, as suggested by arrows 100 in FIG. 8, thereby forcing gas into the grooves 62. Some gas G may be expelled from grooves 62 as part of this step. If the wafer is lowered completely to support surface 60, the there will be good surface-to-surface contact between the bottom of the wafer and non-grooved portions of the wafer support surface 60. Alternatively, the wafer 88 can be held just above the wafer support surface 60 to create a narrow gap therebetween. A gap in the order of 0.010–0.030 inches permits heat to flow from the wafer to the pedestal through a small layer of gas trapped between the wafer and the pedestal. It is still desirable to have grooves 62 in the wafer support surface 60 to prevent the wafer 88 from skating off of the support pins 74 on the small layer of gas. In this alternative embodiment, the wafer is held just above the pedestal to minimize the chance that the pedestal will damage the wafer by metal contamination.

The wafer is then cooled in a step 94. Heat is removed from the wafer by one or more means including by convection, radiation and conduction. The convection cooling is accomplished by means of a gas released into the chamber 16 from a gas source 95 through a valve 96, a conduit 97 in upper enclosure portion 22 and gas inlet port 34. The gas is deflected by upper wall portions 99 of gas inlet port 34 to disperse the gas and to reduce its velocity so that particulates within chamber 16 or on wafer 88 are not dislodged and to prevent wafer 88 from being moved by the force of the gas. The gas from gas source 95 should be substantially anhydrous to prevent reaction with hot wafer 88 and is preferably semiconductor grade hydrogen, helium or nitrogen at ambient pressures and temperatures. While the flow rate of the gas can vary, 5 standard liters per minute has been found to be suitable. The gas shold be exhausted from the chamber 16 by a suitable pump which can be provided by the mainframe unit 12 if the aperture 28 is left open or which can be provided by a separate pumping system (not shown) provided by the wafer cooling apparatus 10 if aperture 28 is closed by a slit valve 26. Depending upon the process, the pressure of the gas within chamber 16 may be reduced below atmospheric pressure by either increasing the exhaust rate of the exhaust pump, decreasing the rate of gas inflow, or both.

As mentioned previously, the wafer is also cooled conductively by the pedestal assembly 18. When the wafer is held slightly above the surface of the pedestal assembly, a convective/conductive path is formed between the wafer and the pedestal assembly 18. Heat is actively removed from the pedestal assembly 18 both by the gas flowing past the pedestal and by the cooling water circulated through the conduit 42. The wafer 88 also cools somewhat by the passive radiation of its heat energy.

In a step 98, the wafer 88 is again raised to a position 88' above the wafer support surface 60 by pins 74. In a step 102, the wafer can be removed from above the pedestal by lowering the wafer 88 onto the robotic support blade and then retracting the support blade into the mainframe unit 12.

While this invention has been described in terms of several preferred embodiments, it is contemplated that various alterations and permutations thereof will become apparent to those skilled in the art. For example, the method of FIG. 7 is applicable, in its most general sense, to lowering of a wafer-like object onto a support surface in any gaseous environment. It is therefore intended that the appended claims include all such alterations and permutations as fall within the true spirit and scope of the present invention.

What is claimed is:

1. A wafer cooling apparatus, comprising: a chamber; a pedestal comprising a support body having a substantially planar wafer support surface exposed to said chamber, said wafer support surface being provided with a groove which is so configured and located as to form an open channel when said wafer is supported on said surface to permit the escape of gas trapped between said wafer and said surface as the wafer is lowered onto the surface to prevent skating; and a mechanism for lowering a wafer disposed within said chamber towards said wafer support surface of said support body, whereby said support body is adapted to remove heat from said wafer.

2. A wafer cooling apparatus as recited in claim 1, further comprising: a conduit for introducing a cooling gas into said chamber.

3. A wafer cooling apparatus as recited in claim 2 wherein said gas is substantially anhydrous and is introduced at substantially ambient pressures and temperatures.

4. A wafer cooling apparatus as recited in claim 3 wherein said gas comprises hydrogen, helium or nitrogen.

5. A wafer cooling apparatus as recited in claim 1, wherein said mechanism for lowering a wafer comprises: at least three pins which retractably extend through said wafer support surface.

6. A wafer cooling apparatus as recited in claim 1, wherein said pedestal further comprises: a heat sink for actively removing heat from said body.

7. A wafer cooling apparatus as recited in claim 6, wherein said heat sink for actively removing heat from said body comprises: a conduit adapted to circulate a cooling fluid proximate to said body.

8. An anti-skating pedestal for wafers, comprising: a body having a substantially planar wafer support surface; and a fluid channel provided in said body which is so configured and located as to form an open channel when said wafer is supported on said surface to permit the escape of gas trapped between said wafer and said surface as the wafer is lowered onto the surface to prevent skating.

9. An anti-skating pedestal for was as recited in claim 8 wherein said fluid channel comprises: a plurality of grooves in said wafer support surface.

10. An anti-skating pedestal for wafers as recited in claim 9 wherein at least some of said grooves form a grid-like pattern.

11. An anti-skating pedestal for wafers as recited in claim 9 wherein at least some of said grooves radiate outwardly from an interior location of said wafer support area.

12. An anti-skating pedestal for wafers as recited in claim 8 wherein said body is made from a material which is a good thermal conductor.

13. An anti-skating pedestal for wafers as recited in claim 12 wherein said material comprises aluminum.

14. An anti-skating pedestal for wafers as recited in claim 12 further comprising: a heat sink for actively removing heat from said body.

15. An anti-skating pedestal for wafers as recited in claim 9 wherein said plurality of grooves have widths greater than about 0.02 inches.

16. A method for lowering a wafer onto a pedestal in a gaseous environment, comprising: positioning a wafer over a substantially planar, grooved surface of a pedestal; extending a plurality of pins through said surface to contact a bottom surface of said wafer; and retracting said plurality of pins into said pedestal to lower said wafer towards said surface, said grooved surface being so configured and located as to form an open channel when said wafer is supported on said surface to permit the escape of gas trapped between said wafer and said surface as the wafer is lowered onto the surface to prevent skating.

17. A method for lowering a wafer as recited in claim 16 wherein said plurality of pins comprise at least three pins.

18. A method for lowering a wafer as recited in claim 16 further comprising enclosing said wafer and said surface from the ambient environment.

19. A method for lowering a wafer as recited in claim 18 further comprising releasing a substantially anhydrous gas proximate to said wafer and said surface.

20. A method for cooling a wafer within a gaseous environment, comprising: extending a plurality of pins through a substantially planar, grooved surface of a pedestal made from a material having good thermal conductivity; contacting a semiconductor wafer with said plurality of pins; retracting said plurality of pins into said pedestal to lower said wafer towards said surface, said grooved surface being so configured and located as to form an open channel when said wafer is supported on said surface to permit the escape of gas trapped between said wafer and said surface as the wafer is lowered onto the surface to prevent skating, whereby said pedestal is adapted to remove heat from said wafer.

21. A method for cooling a wafer as recited in claim 20 further comprising enclosing said wafer and said surface from the ambient environment after contacting said wafer with said plurality of pins.

22. A method for cooling a wafer as recited in claim 21 further comprising releasing a substantially anhydrous gas proximate said wafer and said surface.

23. A method for cooling a wafer as recited in claim 20 further comprising the step of actively removing heat from said pedestal.

24. A method for cooling a wafer as recited in claim 20 wherein said wafer is lowered to said surface.

* * * * *